United States Patent
Song et al.

(10) Patent No.: US 10,191,107 B2
(45) Date of Patent: Jan. 29, 2019

(54) RANKING DEFECTS WITH YIELD IMPACTS

(71) Applicant: GLOBALFOUNDRIES INC., Grand Cayman (KY)

(72) Inventors: Zhigang Song, Hopewell Junction, NY (US); Qian Xu, Hopewell Junction, NY (US); William Davies, Jr., Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 15/440,791

(22) Filed: Feb. 23, 2017

(65) Prior Publication Data

US 2018/0238958 A1 Aug. 23, 2018

(51) Int. Cl.
*G06F 7/556* (2006.01)
*G01R 31/28* (2006.01)
*G06F 17/16* (2006.01)

(52) U.S. Cl.
CPC ......... *G01R 31/2851* (2013.01); *G06F 7/556* (2013.01); *G06F 17/16* (2013.01)

(58) Field of Classification Search
CPC .... G01R 31/2851; G01R 31/26; G01R 31/02; G01R 31/003; G01R 31/00; G06F 7/556; G06F 17/16
See application file for complete search history.

(56) References Cited

U.S. PATENT DOCUMENTS

| 5,665,609 | A | 9/1997 | Mori |
| 5,761,064 | A | 6/1998 | La et al. |
| 6,265,232 | B1 | 7/2001 | Simmons |
| 2007/0288219 | A1 | 12/2007 | Zafar et al. |
| 2008/0167829 | A1 | 7/2008 | Park et al. |
| 2009/0210183 | A1 | 8/2009 | Rajski et al. |

OTHER PUBLICATIONS

Bichebois et al., Analysis of Defect to Yield Correlation on Memories: Method, Algorithms and Limits, 1997 IEEE, pp. 44-52.*
Wong, A.Y., A statistical parametric and probe yield analysis methodology [IC manufacture], Defect and Fault Tolerance in VLSI Systems. IEEE International Conference. Nov. 6-8, 1996, pp. 1-3. Abstract.

* cited by examiner

*Primary Examiner* — Toan Le
(74) *Attorney, Agent, or Firm* — Gibb & Riley, LLC; Michael J. LeStrange, Esq.

(57) ABSTRACT

Failure types that caused defective items to fail testing are identified, the defective items are grouped by the failure types to produce failure-type groups, and the defective items are analyzed to identify defect types that caused the failures. Failure-type limited yield within each of the failure-type groups, and failure-type group-specific defect ratio based on proportions of the defect types within each of the failure-type groups are determined. Additionally, each failure-type group-specific defect ratio is weighted using the failure-type limited yield to produce a weighted failure-type group-specific defect limited yield. For each of the defect types, the weighted failure-type group-specific defect limited yield from each of the failure-type groups is combined to produce the failure-type influenced defect-type total limited yield. Matrix processing is used for the weighting and combination processes. The defect types are ranked based on the failure-type influenced defect-type total limited yield.

20 Claims, 15 Drawing Sheets

| FAILURE TYPE | LIMITED YIELD |
|---|---|
| F1 | LYofF1 |
| F2 | LYofF2 |
| . | . |
| . | . |
| . | . |
| Fx | LYofFx |
| . | . |
| . | . |
| . | . |
| Fm | LYofFm |

FIG. 1

| FAILURE TYPE | DEFECT | PERCENTAGE OF A DEFECT CAUSING FAILURE x |
|---|---|---|
| | D1 | PofD1forFx |
| | D2 | PofD2forFx |
| | . | |
| FX | DY | PofDyforFx |
| | . | |
| | Dn | PofDnforFx |
| | NDF | PofNDFforFx |

FIG. 2

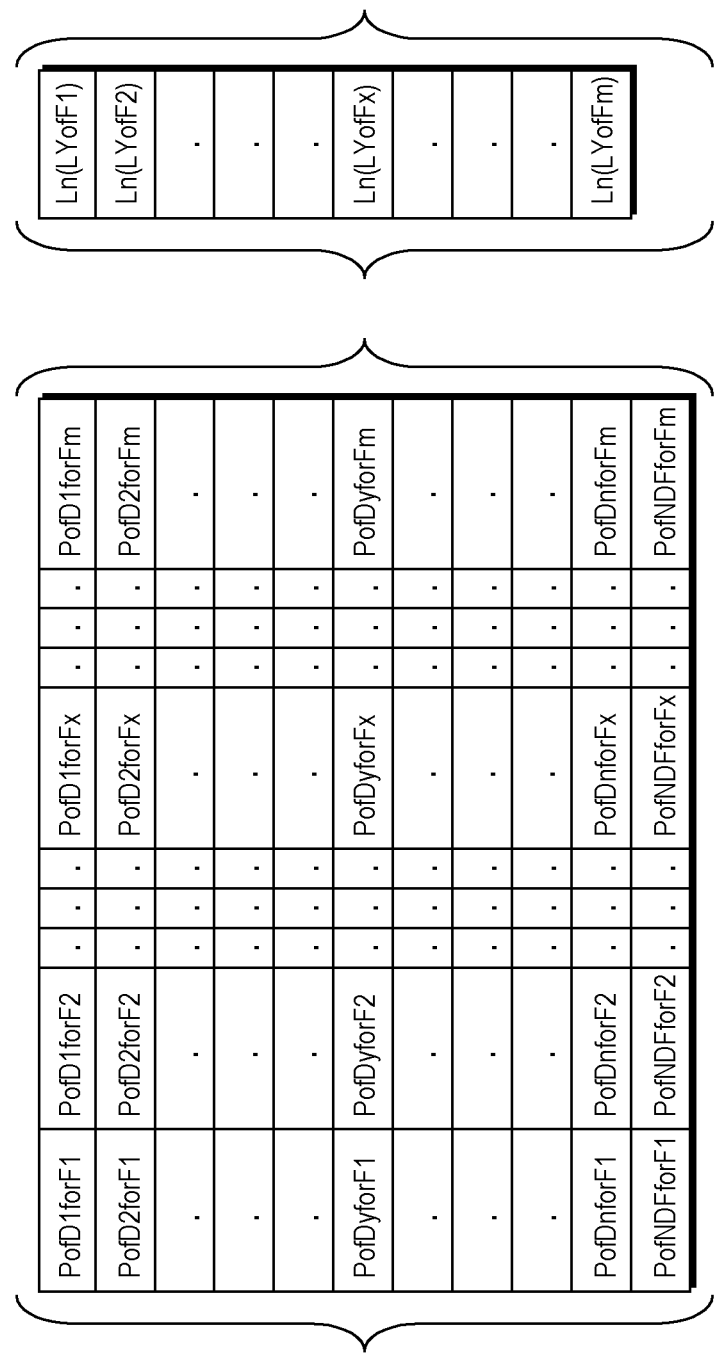

| FAILURE TYPE (Fx) | LIMITED YIELD OF FAILURE | DEFECT TYPE | DEFECT NUMBER |
|---|---|---|---|
| SCF (F1) | 50% | PC MM | 3 |
| | | CA OPEN | 5 |
| | | CA-PC SHORT | 11 |
| | | NDF | 1 |
| | | | |
| VPF (F2) | 70% | CA OPEN | 8 |
| | | M1 MP | 12 |
| | | | |
| HPF (F3) | 90% | M1 MP | 6 |
| | | PC MM | 11 |
| | | NDF | 3 |

FIG. 5

| DEFECT LABEL | DEFECT TYPE |
|---|---|
| D1 | PC MM |
| D2 | CA OPEN |
| D3 | CA-PC SHORT |
| D4 | M1 MP |
| NDF | NDF |

FIG. 6

|  | SCF (F1) | VPF (F2) | HPF (F3) | TOTAL |
|---|---|---|---|---|
| PC MM (D1) | 3 | 0 | 11 | 14 |
| CA OPEN (D2) | 5 | 8 | 0 | 13 |
| CA-PC SHORT (D3) | 11 | 0 | 0 | 11 |
| M1 MP (D4) | 0 | 12 | 6 | 18 |
| NDF | 1 | 0 | 3 | 4 |

FIG. 7

| DEFECT | DEFECT PERCENTAGE | NUMBER |
|---|---|---|
| M1 MP (D4) | 30.0% | 18 |
| PC MM (D1) | 23.3% | 14 |
| CA OPEN (D2) | 21.7% | 13 |
| CA-PC SHORT (D3) | 18.3% | 11 |
| NDF | 6.7% | 4 |

FIG. 8

| FAILURE TYPES | DEFECT TYPES | DEFECT NUMBER | PofDyforF1 | PERCENTAGE |
|---|---|---|---|---|
| SCF (F1) | PC MM (D1) | 3 | PofD1forF1 | 15% |
| | CA OPEN (D2) | 5 | PofD2forF1 | 25% |
| | CA-PC SHORT (D3) | 11 | PofD3forF1 | 55% |
| | NDF | 1 | PofNDFforF3 | 5% |

FIG. 10A

| FAILURE TYPES | DEFECT TYPES | DEFECT NUMBER | PofDyforF2 | PERCENTAGE |
|---|---|---|---|---|
| VPF (F2) | CA OPEN (D2) | 8 | PofD2forF2 | 40% |
| | M1 MP (D4) | 12 | PofD4forF2 | 60% |

FIG. 10B

| FAILURE TYPES | DEFECT TYPES | DEFECT NUMBER | PofDyforF3 | PERCENTAGE |
|---|---|---|---|---|
| HPF (F3) | M1 MP (D4) | 6 | PofD4forF3 | 30% |
| | PC MM (D1) | 11 | PofD1forF3 | 55% |
| | NDF | 3 | PofNDFforF3 | 15% |

FIG. 10C

| DEFECTS | LIMITED YIELD |
|---|---|
| D1 | 0.850508936 |
| D2 | 0.729090966 |
| D3 | 0.683020128 |
| D4 | 0.782224793 |
| NDF | 0.950790594 |

FIG. 13

| DEFECTS | LIMITED YIELD |
|---|---|
| CA-PC SHORT (D3) | 0.683020128 |
| CA OPEN (D2) | 0.729090966 |
| M1 MP (D4) | 0.782224793 |
| PC MM (D1) | 0.850508936 |
| NDF | 0.950790594 |

FIG. 14

RANKING DEFECTS WITH YIELD IMPACTS

BACKGROUND

The present disclosure relates to defect detection within manufactured goods, and more specifically, to determining the most effective order in which to address discovered defects.

Improving yield increases manufacturing efficiency, which reduces waste and cost, and improves reliability. Yield is the percentage of non-defective products produced by a process. Related to yield is the concept of failure, which is an electrical signature causing a device to malfunction (which can be obtained by electrical testing, for examples, power shorts, input/output (I/O) pin open, automatic test pattern generation (ATPG) failure or scan chain failure etc., for logic; and single cell failure (SCF), vertical pair failure (VPF) and horizontal pair failure (HPF) etc., for static random access memory (SRAM)). Further, a defect is a physical abnormality causing such an electrical signature. The methodologies of identifying a defect include failure analysis, which includes the electrical and physical processes preformed to identify the defect for the failure, or matching hits, which is the process of matching the inline inspection physical defect maps with functional test failure maps (bit fail map). Additionally, there can sometimes be No Defect Found (NDF) after failure analysis, or no inline inspection defect correlated to an electrical failure.

As advanced semiconductor technology becomes more complicated, the types of defects are increasing and the root cause identification and resolution for each type of defect also becomes more challenging. In order to achieve fast yield improvement under this situation with so many types of defects and limited resources, it is important to deploy the limited resources to focus on the defects with the greatest yield impact.

Yield can be defined using different concepts including functional considerations (whether the device has the intended functionality, e.g., performs the functions it is designed to perform), and parametric considerations (whether the device performs within the intended operating range, e.g., speed, power, voltage, resistance, temperature, etc.); and yield can also consider production efficiency. Defects that reduce yield can occur because of faulty designs and/or faulty manufacturing. Therefore, design yield can be found by looking to the functional and parametric components; while manufacturing yield looks to the percentage of items that are produced without physical defects, and is generally discovered by physically, visually, or electrically testing the manufactured product.

The concept of defect limited yield (DLY) is the ratio of product that meets functional specifications to the total product made, and is contrasted with the concept of circuit limited yield (CLY) which is the ratio of the product that meets or exceeds performance specifications to the total product made. The systems and methods discussed below relate to such yield considerations.

SUMMARY

Various methods herein identify failure types that caused defective items to fail testing, group the defective items by the failure types to produce failure-type groups, and determine failure-type limited yield within each of the failure-type groups. Such methods analyze the defective items in each failure-type group to identify defect types that caused the failure types, and also determine failure-type group-specific defect ratios based on proportions of the defect types within each of the failure-type groups. Additionally, these methods weight each of the failure-type group-specific defect ratios using the failure-type limited yield, to produce a weighted failure-type group-specific defect limited yield for each of the defect types within each of the failure-type groups. For each of the defect types, these methods combine the weighted failure-type group-specific defect limited yield from each of the failure-type groups to produce a failure-type influenced defect-type total limited yield for each of defect types. These methods include matrix processing for the weighting and combination processes. These methods rank the defect types based on the failure-type influenced defect-type total limited yield for working on defect solutions to resolve the defect types in order of the ranking of the defect types for fast yield improvement.

Additional methods herein test manufactured items for failures, so as to identify defective items, and identify the failure types that caused the defective items to fail the testing. The testing includes electrical testing, and the failure types include types of electrical signatures. In addition, these methods group the defective items by the failure types, to produce failure-type groups, where each of the groups has one group-specific failure type. Once grouped, these methods determine a first proportion or ratio that is the ratio of the number of defective items within each of the failure-type groups to the total number of manufactured items. The first ratio is subtracted from 1, to produce a failure-type limited yield for each of the failure-type groups.

These methods analyze (electrically and physically) the defective items for physical defects, so as to identify defect types that caused such failures. For each failure-type group, these methods determining the defect-types include failure analysis, or by matching the inline inspection physical defect maps with functional test failure maps (bit fail map). Each of the defect types can cause multiple failure types, and each of the failure types can result from multiple defect types. Further, the defect types include characteristics of the manufactured items that diverge from a design of the manufactured items.

Further, within each failure-type group, for each type of defect (of the defect types that caused the group-specific failure type), these methods determine the number of defective items that have that type of defect Similarly, for each type of defect (of the defect types that caused the group-specific failure type within each failure-type group), these methods determine a second proportion or second ratio, that is the ratio of the number of defective items that have that type of defect to the total number of defective items analyzed in the failure-type group, to produce a failure-type group-specific defect ratio (that is specific to the failure-type group).

This allows these methods to weight each failure-type group-specific defect ratio, using the failure-type limited yield of the failure-type group as the weighting factor, to produce a weighted failure-type group-specific defect limited yield for each of the defect types within the failure-type group. Then, for each of the defect types, these methods combine all the weighted failure-type group-specific defect limited yields from each of the failure-type groups to produce a failure-type influenced defect-type total limited yield for each of defect types.

The weighting and combination processes includes forming a matrix and a vector and applying matrix processing to produce the failure-type influenced defect-type total limited yield for each of defect types. Each element of the matrix is a failure-type group-specific defect ratio. For example, the matrix can include the failure-type group-specific all defect ratios within a failure type group as a column, while the failure-type group-specific defect ratios for all failure-type groups as a row. More specifically, for example, the element at column x and row y is the failure-type x group-specific defect type y ratio within failure-type x group. The matrix processing also includes applying a natural logarithmic function to each failure type limited yield to create a vector. This matrix processing further includes calculating the product of the matrix, formed by failure-type group specific defect ratios, and the vector, formed by the natural logarithmic value of the failure-type limited yield, to produce a natural logarithmic value of the failure-type influenced defect-type total limited yield. Further, e power function is applied to the natural logarithmic value of the failure-type influenced defect-type total limited yield to produce the failure-type influenced defect-type total limited yield. Further, the natural logarithmic function is:

$$\text{Ln}(LYofDy) = \sum_{x=1}^{m}(PofDyforFx) * \text{Ln}(LYofFx))$$

where: Ln is the natural logarithmic function of the following variables, LY is limited yield, Dy is defect type y, P is proportion, and Fx is failure type x.

These methods rank the defect types, in inverse order to the failure-type influenced defect-type total limited yield. With this ranking, these methods can produce the most yield improvement by applying defect solutions to resolve the defect type, in order of the ranking of the defect types.

Various systems herein include (among other components) electrical testing equipment capable of automatically testing manufactured items for failures to identify defective items. The electrical testing equipment is capable of performing electrical testing, and the failure types include types of electrical signatures. Also, a processor is electrically connected to the electrical testing equipment. The processor is capable of automatically identifying failure types that caused the defective items to fail the testing. In addition, the processor is capable of automatically grouping the defective items by the failure types to produce failure-type groups (that each has one group-specific failure type). The processor is capable of automatically determining a first ratio of the number of defective items within each of the failure-type groups to the total number of the manufactured items, and subtracting the first ratio from 1, to produce a failure-type limited yield for each of the failure-type groups.

Defect identification (electrically and physically) equipment is electrically connected to the processor. The defect identification equipment is capable of automatically analyzing the defective items for physical defects to identify defect types that caused the failures. Each of the physical defect types can cause multiple failure types, and each of the failure types can result from multiple defect types.

Within each failure-type group (of the failure-type groups), for each type of physical defect (of the physical defect types that caused the group-specific failure type), the processor is capable of automatically determining the number of defective items that have that type of defect. Similarly, for each type of defect (of the physical defect types that caused the group-specific failure type) the processor is capable of automatically determining a second ratio of the number of defective items that have that type of defect to the total number of defective items analyzed in the failure-type group, to produce a failure-type group-specific defect ratio.

Additionally, the processor is capable of automatically weighting each failure-type group-specific defect ratio using the failure-type limited yield of the failure-type group to produce a weighted failure-type group-specific defect limited yield for each of the physical defect types within the failure-type group. Further, for each of the physical defect types, the processor is capable of automatically combining the weighted failure-type group-specific defect limited yield from each of the failure-type groups, to produce a failure-type influenced defect-type total limited yield for each of the physical defect types.

More specifically, the processor is capable of performing the weighting and combination processes by automatically forming a matrix and a vector and applying matrix processing to produce the failure-type influenced defect-type total limited yield for each of defect types. Each element of the matrix is a failure-type group-specific defect ratio. For example, the matrix can include the failure-type group-specific all defect ratios within a failure type group as a column, while the failure-type group-specific defect ratios for all failure-type groups as a row. More specifically, for example, the element at column x and row y is the failure-type x group-specific defect type y ratio within failure-type x group. The matrix processing also includes applying a natural logarithmic function to each failure type limited yield to create a vector. The processor is capable of performing the matrix processing to calculate the product of the matrix and the vector to produce a natural logarithmic value of the failure-type influenced defect-type total limited yield. Further, e power function is applied to the natural logarithmic value of the failure-type influenced defect-type total limited yield to produce the failure-type influenced defect-type total limited yield. Further, the natural logarithmic function is:

$$\text{Ln}(LYofDy) = \sum_{x=1}^{m}(PofDyforFx) * \text{Ln}(LYofFx)),$$

where: Ln is the natural logarithmic function of the following variables, LY is limited yield, Dy is defect type y, P is proportion, and Fx is failure type x.

The processor is also capable of automatically ranking the physical defect types in inverse order to the failure-type influenced defect-type total limited yield.

BRIEF DESCRIPTION OF THE DRAWINGS

The embodiments herein will be better understood from the following detailed description with reference to the drawings, which are not necessarily drawn to scale and in which:

FIG. 1 is a table showing failure type and limited yield;

FIG. 2 is a table showing failure type and defect percentage;

FIG. 3A-3C are matrix, vector, and schematic diagrams illustrating a matrix process;

FIG. 5 is a table showing failure type, yield, and defects;

FIG. 6 is a table showing defect label and defect type;

FIG. 7 is a table showing failure types and defect types;

FIG. 8 is a table showing defects and defect percentages;

FIG. 10A-10C are tables showing failure types, defect types and defect percentages within a failure type;

FIGS. 13 and 14 are tables showing defects and limited yield;

DETAILED DESCRIPTION

Figure 3C:
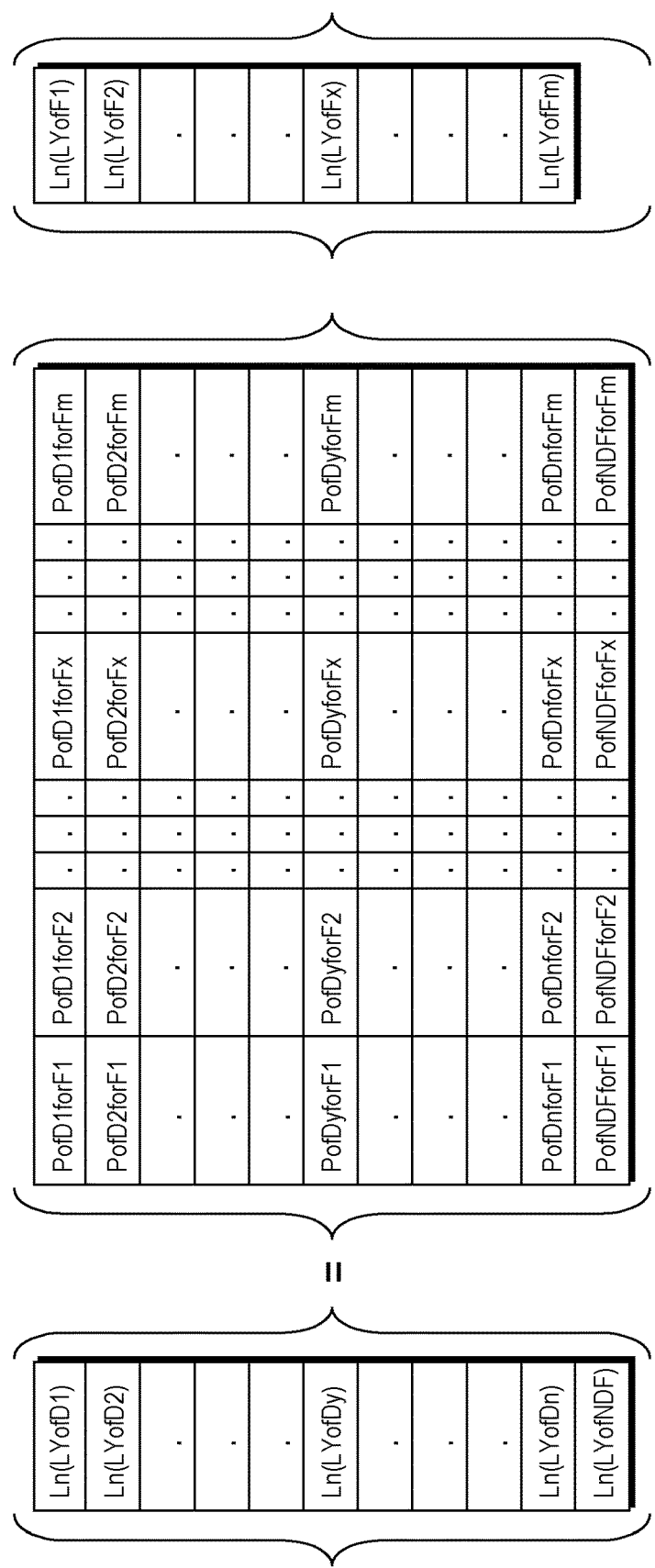

As mentioned above, the concept of defect limited yield (DLY) is the ratio of the product that meets functional specifications to the total product made. The systems and methods herein provide a systematic methodology of accurately ranking defects with their yield impacts.

Defect Pareto built by failure analysis can be used to prioritize the defect types to work on, and simplistic defect Pareto can merely include sampling and defect statistical calculation that identify, for example, defect types with their counts. However, failures and defects are well interwoven, and one type of defect can cause multiple types of failures, and one type of failure could be caused by multiple types of defects. Therefore, a defect type with the highest count in the defect Pareto is not always the defect type with the highest yield loss. Thus, this disclosure provides a systematic methodology to accurately rank defects by their yield impacts. Specifically, the systems and methods herein identify the quantity of all failure types from wafer testing, and this allows the limited yield of each failure type, such as failure type x, signified by LYofFx, to be calculated.

Again, each failure type could be caused by multiple types of defects. The percentage of each type of defect causing a failure type is thus calculated. For example, the defect percentage of defect type y causing failure type x, signified by PofDyforFx (x=1,2 ... m, y=1,2 ... n). For NDF (No Defect Found) case, it is signified by PofNDFforFx. The defect types for each failure type can be obtained by failure analysis or by matching hits of the inline inspection physical defects with the functional test failure maps. Similarly, each type of defect can cause multiple types of failure.

Then, the systems and methods herein put the percentages of all defect types causing all selected failure types together to form a matrix and take natural logarithmic function to the failure-type limited yield to form a vector. Additionally, the systems and methods herein calculate a defect type total limited yield LYofDy based on each failure type limited yield and the defect percentage causing each failure type. This allows the limited yield for all defect types to be calculated from the matrix and the vector. Then, the systems and methods herein rank the defects according to the limited yield of each defect type, from low to high. The defect with lowest limited yield should receive more attention, because eliminating or fixing the defect with lowest limited yield will produce the most yield improvement.

FIG. 1 is a table showing all failure types and their limited yields. The systems and methods herein calculate the limited yield of each failure type, using the following formula; the limited yield of Failure type x:

$$LYofFx = 1 - \frac{\text{the number of chips with } Fx}{\text{the total chips tested for } Fx}.$$

In order to calculate the percentage of a type of defect causing a type of failure, the systems and methods herein can perform failure analysis on all or various selected failure types or by matching hits of the inline inspection physical defects with the functional test failure maps, which provides many more types of defect versus failure types.

The systems and methods herein then perform failure analysis on all the selected failure types. For example, failure analysis is performed on failure type x and several types of defects, such as, D1, D2, ... are found. If no defect is found on a site, it is called NDF. The systems and methods herein use the failure analysis data to demonstrate how to calculate the percentage of a type of defect such as defect type y causing the failure type x. This is calculated using the formula: the percentage of defect type y causing failure x, $$PofDyforFx = \frac{\text{the number of } Dy \text{ found for } Fx}{\text{the total } Fx \text{ sites analyzed}}$$

and the results are shown in the table of FIG. 2, which lists the failure analysis results for failure type x and the percentage of each defect causing failure type x.

The systems and methods can calculate the defect y limited yield for failure type x by using the following formula, LYofDyforFx=(LYofFx)$^{PofDyforFx}$, however more often than not, a type of defect can cause multiple failure types. Therefore, the total limited yield of defect type y for all selected failure types can be calculated by the product of LYofDyforFx as represented by the formula:

$$LYofDy = \prod_{X=1}^{m} LYofDyforFx = \prod_{x=1}^{m} ((LYofFx)^{PofDyforFx})$$

Since failures and defects are well interwoven, namely, one type of defect can cause multiple types of failures and one type of failure could be caused by multiple types of defects, such calculation is complicated and time consuming if the failure and defect type number increases. To handle this issue, the systems and methods provides a matrix process. A natural logarithm is taken at both sides of the formula here:

$$\text{Ln}(LYofDy) = \text{Ln}(\prod_{x=1}^{m} ((LYofFx)^{PofDyforFx}),$$

The equation becomes the next equation after two operations by Ln(A*B)=LnA+LnB combined with Lnx$^x$=nLnX:

$$\text{Ln}(LYofDy) = \sum_{x=1}^{m} (PofDyforFx) * \text{Ln}(LYofFx)).$$

The calculation of the total limited yield of all defect types for all selected failure types can be done by a matrix process. The defect types, D1, D2 ... Dn, are the defects found by failure analysis on all selected failure types. If defect type y is not found for failure type x, then PofDyforFx=0. FIG. 3A is a matrix formed by the failure-type group specific defect ratios and FIG. 3B is a vector created by the natural logarithmic value of the failure-type limited yield. With this matrix process as shown in FIG. 3C, the systems and methods ensure that the large failure types and many defect types (the situation with multiple types of defects causing a failure type and a type of defect causing multiple failure types) can be easily handled.

Figure 4:
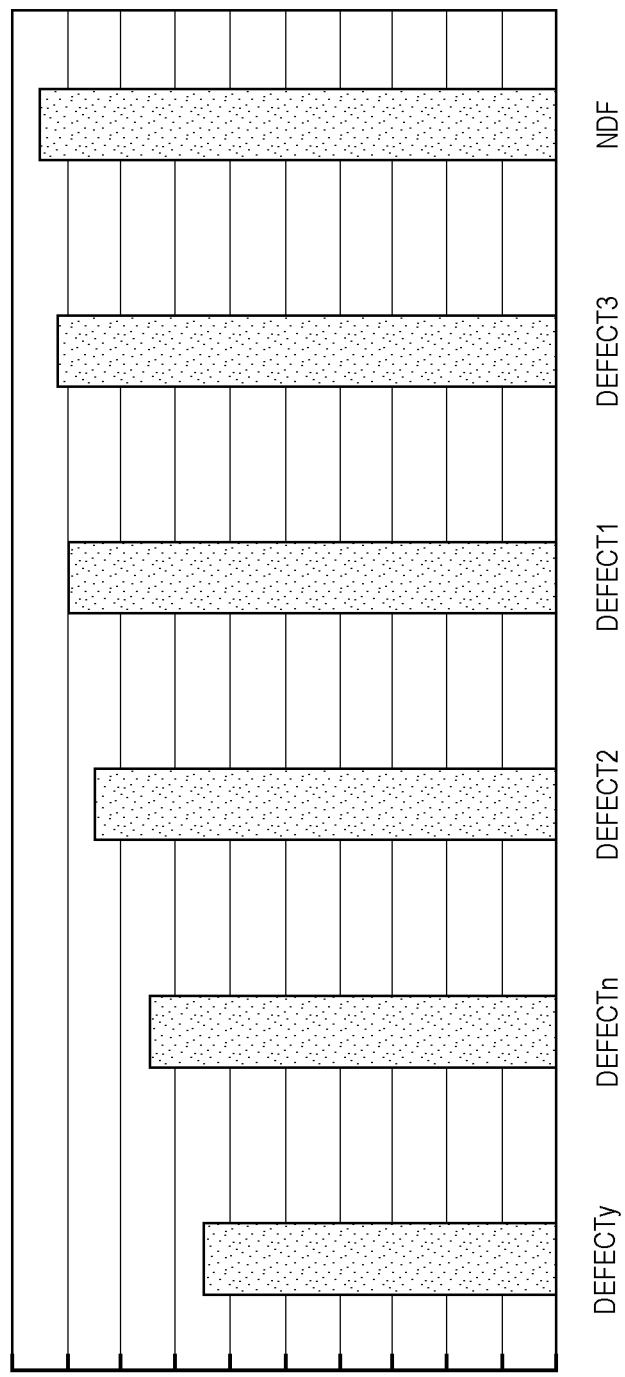
FIG. 4 is a chart showing defect total limited yield.

The systems and methods further rank the defects with their total limited yields and plot a bar chart as shown in FIG. 4. These defects with lowest bars in the chart indicate which defects need to be focused on first for greatest yield improvement. The systems and methods in FIG. 4 show 1 minus the value of each bar indicates the yield opportunity, if the defect is eliminated.

FIG. 5 demonstrates the example of SRAM wafers where the top three failure types are F1: SCF with limited yield of 50%, F2: VPF with limited yield of 70%, and F3: HPF with limited yield of 90%. The failure analysis is performed on the top three failure types with 20 sites for each failure type, as seen in FIG. 5 with the failure analysis results.

FIG. 6 is a table showing all the types of defects for all the failure types (e.g., polysilicon conductor micro mask (PC MM); open contact (CA open); contact-polysilicon conductor short (CA-PC short); metallization layer 1 missing pattern (M1 MP); and no defect found (NDF)) and has labeled them as D1, D2, D3, D4, NDF. FIG. 7 shows the sum of the number of each defect type found for selected failure types. The percentage of each defect type can be calculated, accounting for the total defect numbers and ranked, as shown in FIGS. 8 and 9.

Figure 9:
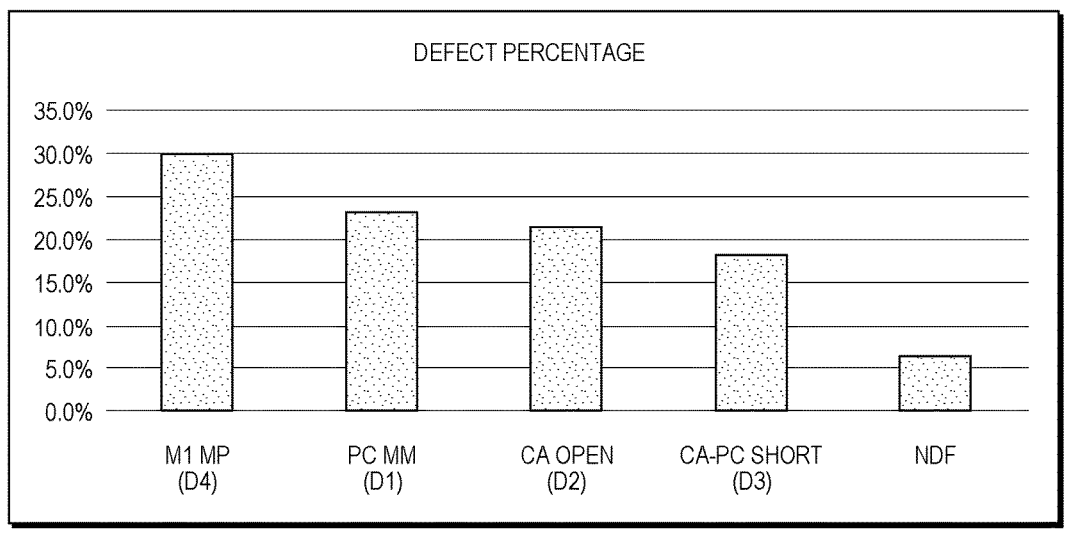
FIG. 9 is a chart showing defect percentages.

However, rather than simplistically looking to only the percentage ranking of various defects as shown in FIGS. 8 and 9, instead the systems and methods described herein calculate the total limited yield of each type of defect, considering the weight of each failure type using the matrix process described above. First the systems and methods, calculate the percentage of each type of defect causing a failure type, as shown in FIGS. 10A-10C. For example, the percentage of PC MM (D1) causing SCF (F1) is: PofD1forF1=3/20=15%. The percentages of each type of defect causing each failure type are shown in FIGS. 10A-10C.

Figure 11:
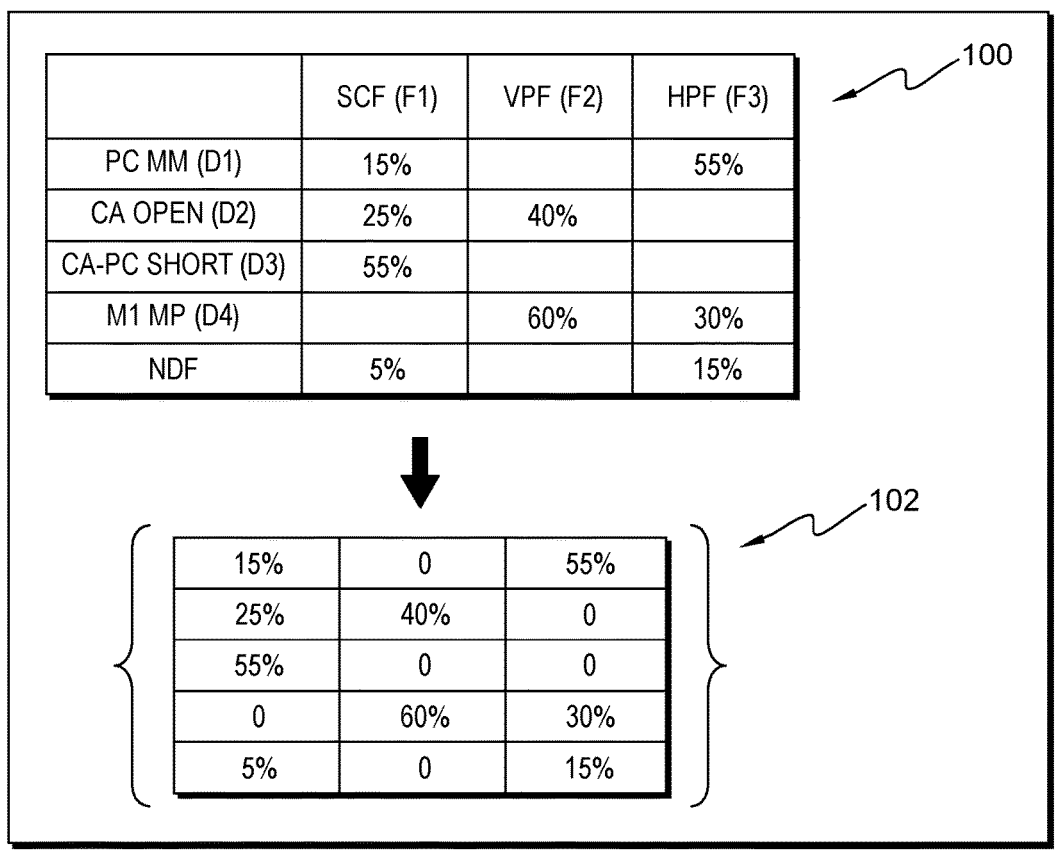
FIG. 11 is a schematic diagram showing a table translating into a matrix.

FIG. 11 shows matrix 102 resulting from table 100, which is based on the percentage of each type of defect causing each failure type. Note that PofDyforFx is zero if the defect type y does not cause failure type x.

Figure 12:
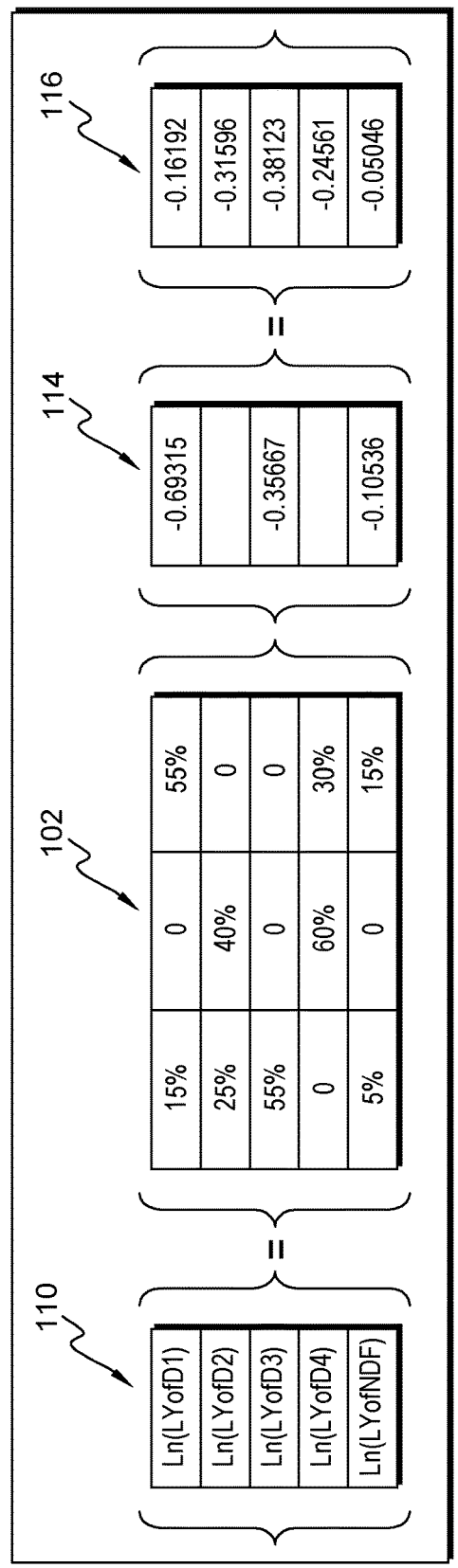
FIG. 12 is a schematic diagram showing the matrix process for the example.

FIG. 12 is a schematic diagram showing the matrix process of matrix 102 and the vector 114, created by the natural logarithmic value of the failure-type limited yield. Thus, in FIG. 12, the vector 110 (natural logarithm of defect-type limited yield) is equal to the product of matrix 102 and the vector 114, and the result is shown in vector 116. In this way, the systems and methods perform a calculation based on the matrix process to produce the value of natural logarithm of the total limited yield of the various defect types (D1: PC MM, D2: CA open, D3: CA-PC short and D4: M1 MP) for the associated failure types (F1: SCF, F2: VPF and F3: HPF). With applying e power function to the values in vector 116, the systems and methods can get the defect total limited yield from the value of nature logarithm of the defect total limited yield, shown as in the table of FIG. 13.

Figure 15:
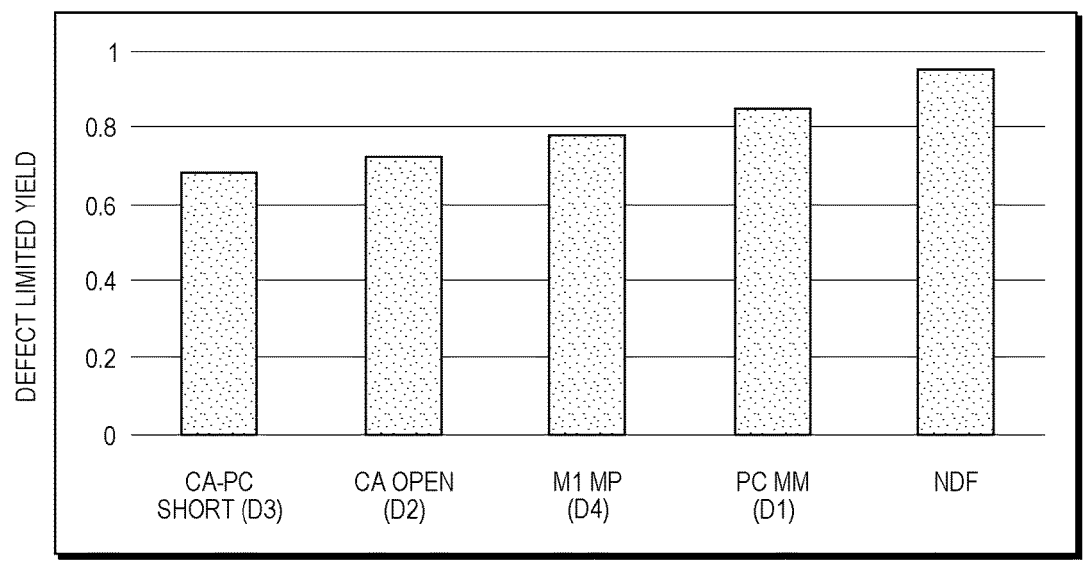
FIG. 15 is a chart showing defect total limited yield.

FIG. 14 is a table showing real defect names with their total limited yields, and these systems and methods rank them from lowest and highest. FIG. 15 is a chart showing the defect total limited yield, calculated with the methodology described herein. Comparing FIG. 9 to FIG. 15, it can be seen that rather than simply prioritizing working out solutions to the most common defect in FIG. 9 ($1^{st}$: M1 MP; $2^{nd}$: PC MM; $^{rd}$: CA open; etc. based purely on defect percentage), with systems and methods herein the defect percentage is weighted according to the limited yield of the failure type(s) that the defect causes, to result in the failure-type influenced defect-type total limited yield for each of defect types shown in FIG. 15. Therefore, with systems and methods herein, a different prioritization of working out solutions is applied as follows $1^{st}$: CA-PC short; $2^{nd}$: CA open; $3^{rd}$: M1 MP; etc.

Therefore the systems and methods described herein can create the matrix of percentages of defect types for failure types and create the vector of natural logarithm of limited yield of failure types, and further the systems and methods provide a systematic methodology of calculating the limited yields of defects based on failure type limited yield and failure analysis results.

The systems and methods described herein can also be applied with different sources of defect data, like by matching hits of the inline inspection physical defects with the functional test failure maps, for a wafer/several wafers, or a lot/several lots, namely populations with multiple failure types, caused by multiple defect types. These systems and methods further calculate the limited yields of all types of failure and create the vector of natural logarithm of limited yield of failure types. The systems and methods here also enable the creation of the matrix of percentages of defect types for failure types and calculate the total limited yield of each type of defect with a systematic methodology.

This allows these systems and methods to accurately rank the defects based on their yield impact, namely the total limited yield of the defect types based on the methodology described in this disclosure, and to identify and prioritize yield opportunities using limited yield by defect type for a set of units under test (these include group units into failure types and determine limited yields by failure type based on test results).

Figure 16:
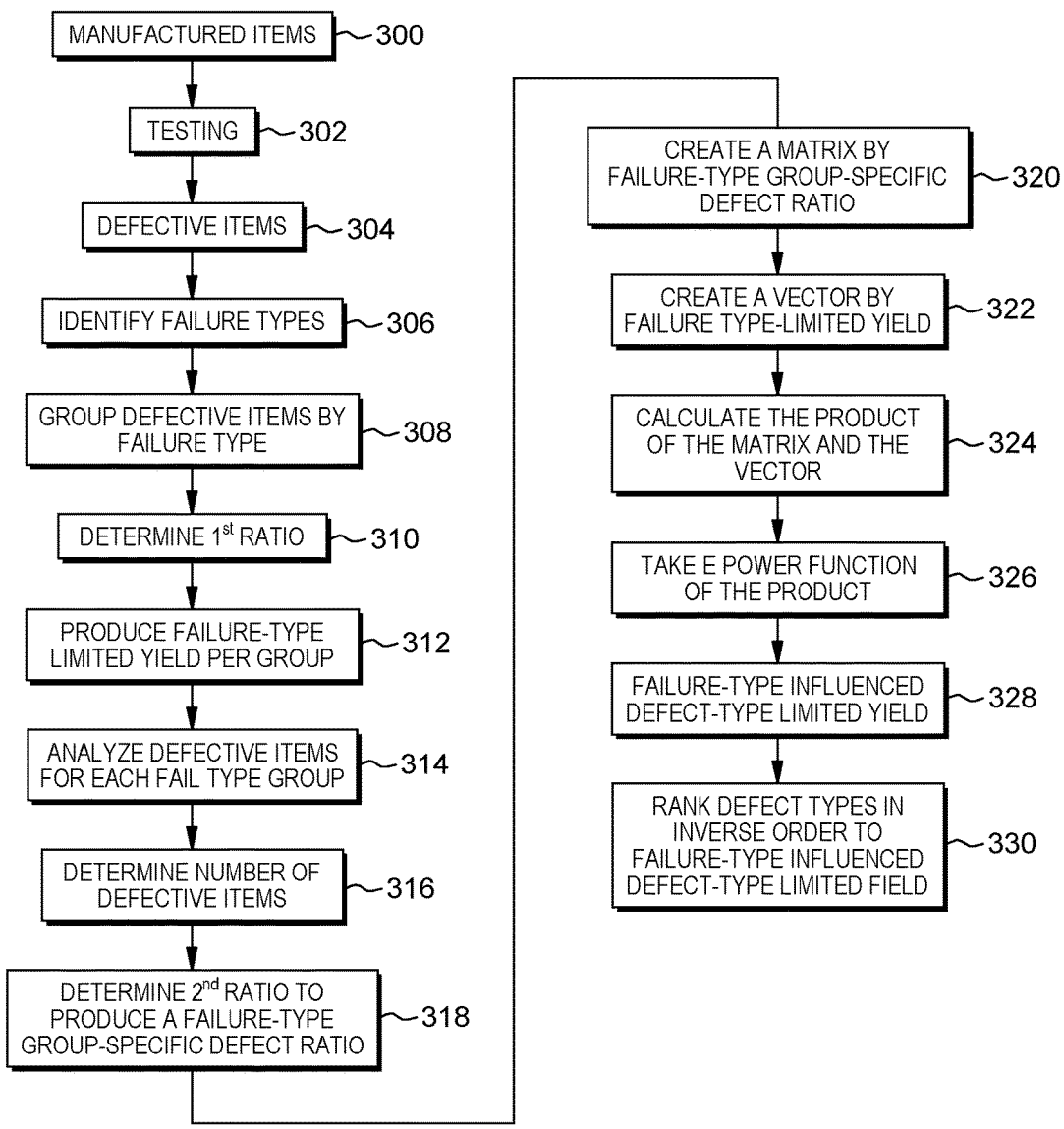
FIG. 16 is a flow diagram illustrating methods herein.

As shown in flowchart form in FIG. 16, some methods herein begin by testing manufactured items (item 300) for failures (item 302), so as to identify defective items (item 304). The testing (302) includes electrical testing, and the failure types include types of electrical signatures. These methods also identify the failure types that caused the defective items to fail the testing (item 306). In addition, these methods group the defective items by the failure types, to produce failure-type groups, where each of the groups has one group-specific failure type (item 308). Once grouped, these methods determine a first proportion or ratio (item 310), that is the ratio of the number of defective items within each of the failure-type groups to the total number of manufactured items. The first ratio is subtracted from 1, to produce a failure-type limited yield for each of the failure-type groups (item 312).

These methods analyze (electrically and physically) the defective items for physical defects, so as to identify defect types that caused such failures (item 314). For each failure-type group, these methods determining the defect-types include failure analysis, or by matching the inline inspection physical defect maps with functional test failure maps (bit fail map). Each of the defect types can cause multiple failure types, and each of the failure types can result from multiple defect types. Further, the physical defect types include characteristics of the manufactured items that diverge from the physical design of the manufactured items.

Furthermore, within each failure-type group, for each type of defect (of the defect types that caused the group-specific failure type), these methods determine the number of defective items that have that type of defect (item 316). Then, again for each type of defect (of the defect types that caused the group-specific failure type) these methods determine a second proportion or second ratio (item 318), that is the ratio of the number of defective items that have that type of defect to the total number of defective items analyzed in the failure-type group, to produce a failure-type group-specific defect ratio that is specific to the defect type within the failure-type group (item 318).

This allows these methods to weight each failure-type group-specific defect ratio, using the failure-type limited yield of the failure-type group as the weighting factor, to produce a weighted failure-type group-specific defect limited yield for each of the defect types within the failure-type group, and combine all the weighted failure-type group-specific defect limited yield for each of the defect types for all the failure-type groups to produce the failure-type influenced defect-type total limited yield for each of defect types.

The weighting and combination processes include forming a matrix (item 320) and a vector (item 322) and applying matrix processing (item 324) to produce the failure-type influenced defect-type total limited yield for each of defect types (item 328). Each element of the matrix is a failure-type group-specific defect ratio (item 320). For example, the matrix can include the failure-type group-specific for all defect ratios within a failure type group as a column, while the failure-type group-specific defect ratios for all failure-type groups as a row. More specifically, for example, the element at column x and row y is the failure-type x group-specific defect type y ratio within failure-type x group. The matrix processing also includes applying a natural logarithmic function to each failure type limited yield to create a vector (item 322). This matrix processing further includes calculating the product of the matrix and the vector to produce a natural logarithmic value of the failure-type influenced defect-type total limited yield. Further, e power function is applied to the natural logarithmic value of the failure-type influenced defect-type total limited yield (item 326) to produce the failure-type influenced defect-type total limited yield (item 328). Further, the natural logarithmic function is:

$$\mathrm{Ln}(LYofDy) = \sum_{x=1}^{m} (PofDyforFx) * \mathrm{Ln}(LYofFx)),$$

where: Ln is the natural logarithmic function of the following variables, LY is limited yield, Dy is defect type y, P is proportion, and Fx is failure type x.

Then, these methods rank the defect types, in inverse order to the failure-type influenced defect-type total limited yield (item 330) to rank defect type with the highest yield loss at the top of the ranking, with lower yield loss defect types ranked successively lower.

With this ranking, these methods can produce the most yield improvement by working out defect solutions to resolve the defect type, in order of the ranking of the defect types. The defect type with lowest failure-type influenced defect-type total limited yield will be corrected before other defect types, because eliminating or fixing the defect with lowest failure-type influenced defect-type total limited yield will produce the most yield improvement. Further, with limited resources, if all defect types cannot be addressed simultaneously, only those defect types at the top of the defect type ranking (e.g., top 10%, top 25%, top 50%, etc.) will be corrected first.

The method as described above is used in the fabrication of integrated circuit chips. The present embodiments may be a system, a method, and/or a computer program product. The computer program product may include a computer readable storage medium (or media) having computer readable program instructions thereon for causing a processor to carry out aspects of the present embodiments.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present embodiments may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present embodiments.

Aspects of the present embodiments are described herein with reference to flowchart illustrations and/or block diagrams of methods, apparatus (systems), and computer program products according to embodiments herein. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 17:
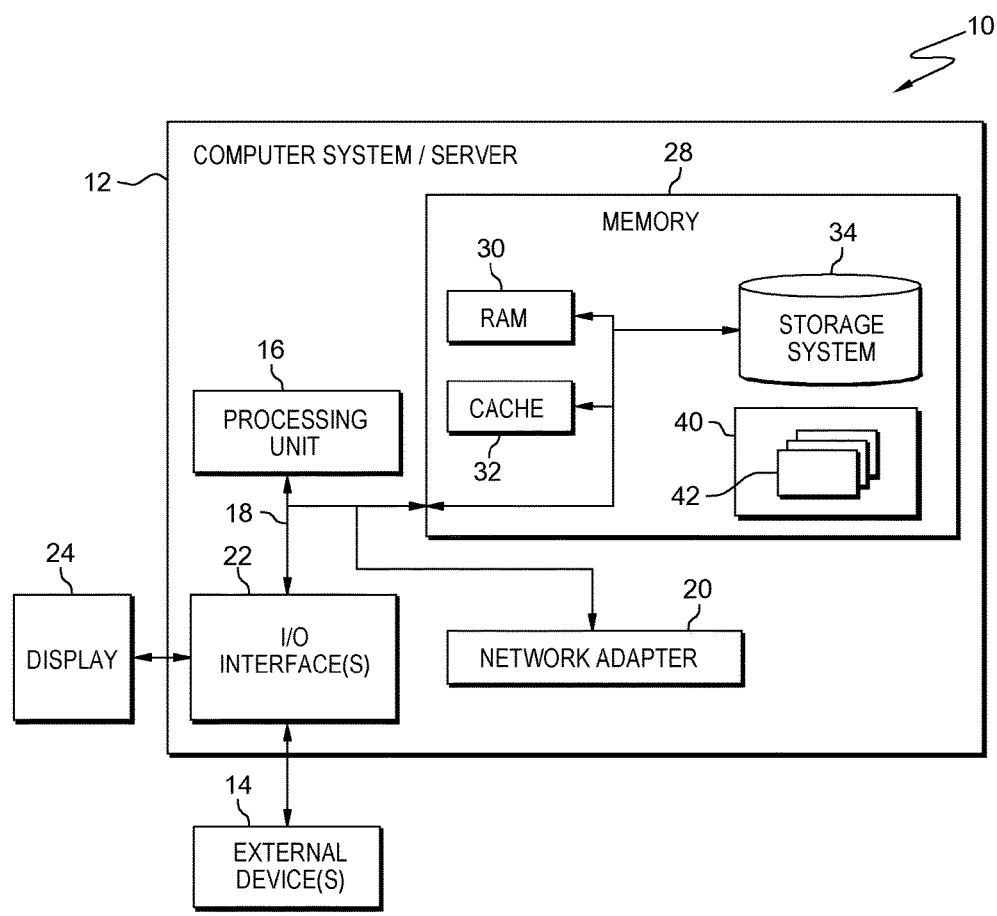
FIG. 17 is a schematic diagram of a hardware system according to embodiments herein.

Referring now to FIG. 17, a schematic of an example of a system is shown. System 10 is only one example of a suitable system and is not intended to suggest any limitation as to the scope of use or functionality of embodiments herein described herein. Regardless, system 10 is capable of being implemented and/or performing any of the functionality set forth hereinabove.

In system 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in computing environments where tasks are performed by remote processing devices that are linked through a communications network. In a computing environment, program modules may be located in both local and remote computer system storage media including memory storage devices.

As shown in FIG. 17, computer system/server 12 in system 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments herein.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments herein as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

Figure 18:
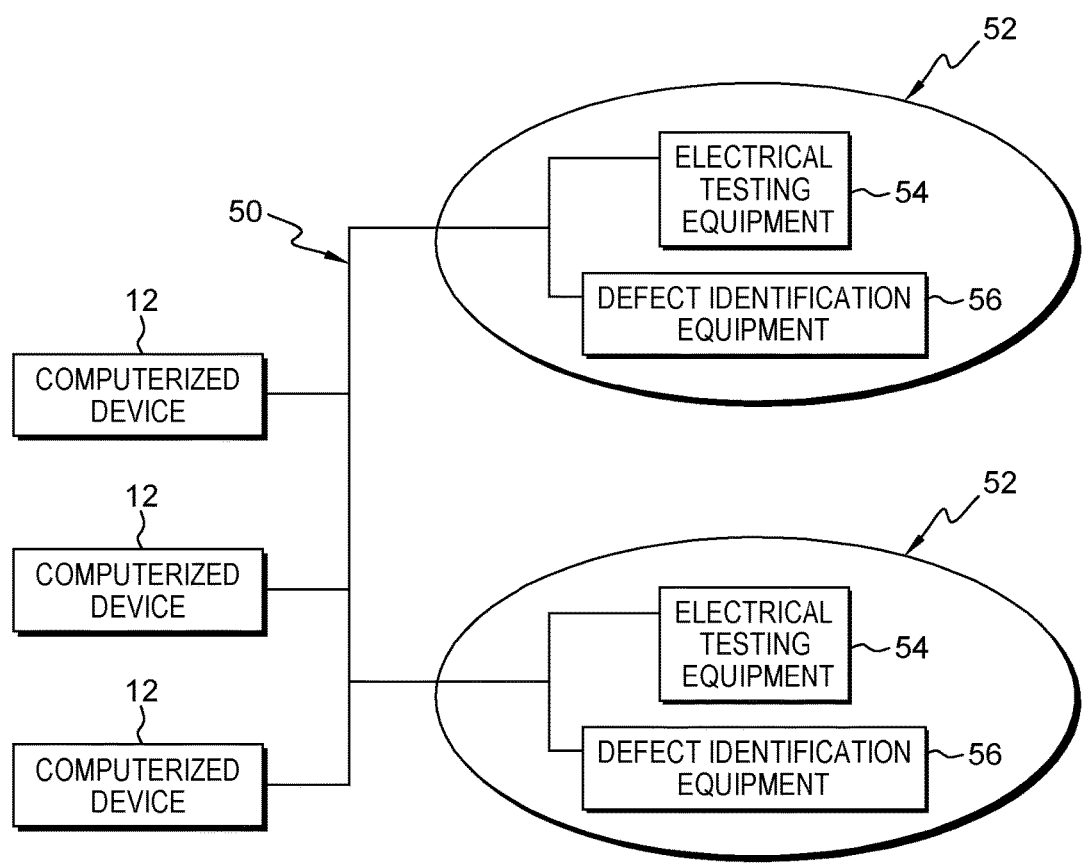
FIG. 18 is a schematic diagram of systems herein.

As shown in FIG. 18, exemplary systems and methods herein include various computerized devices 12 (described above), electrical testing equipment 54, and defect identification equipment 56 located at various different physical locations 52. The computerized devices 12 can include servers, virtual devices, personal computers, etc., and are in communication (operatively connected to) each other and the electrical testing equipment 54, and defect identification equipment 56 by way of a local or wide area (wired or wireless) network 50.

Therefore, various systems herein include (among other components) electrical testing equipment 54 capable of automatically testing manufactured items for failures to identify defective items. The electrical testing equipment 54 is capable of performing electrical testing, and the failure types include types of electrical signatures. Also, a processor 16 (FIG. 17) within the computerized devices 12 is electrically connected to the electrical testing equipment 54. The processor 16 is capable of automatically identifying failure types that caused the defective items to fail the testing. In addition, the processor 16 is capable of automatically grouping the defective items by the failure types to produce failure-type groups (that each has one group-specific failure type). The processor 16 is capable of automatically determining a first ratio of the number of defective items within each of the failure-type groups to the total number of the manufactured items, and subtracting the first ratio from 1, to produce a failure-type limited yield for each of the failure-type groups.

Defect identification equipment is electrically connected to the processor 16. The defect identification equipment 56 is capable of automatically analyzing the defective items for physical defects to identify defect types that caused the failures. Each of the defect types can cause multiple failure types, and each of the failure types can result from multiple defect types. Within each failure-type group (of the failure-type groups), for each type of defect (of the physical defect types that caused the group-specific failure type), the processor 16 is capable of automatically determining the number of devices that have that type of defect. Similarly, for each type of defect (of the physical defect types that caused the group-specific failure type) the processor 16 is capable of automatically determining a second ratio of the number of devices that have that type of defect to the total number of defective items analyzed in the failure-type group, to produce a failure-type group-specific defect ratio.

Additionally, the processor 16 is capable of automatically weighting each failure-type group-specific defect ratio using the failure-type limited yield of the failure-type group to produce a weighted failure-type group-specific defect limited yield for each of the physical defect types within the failure-type group and combining all the weighted failure-type group-specific defect limited yield for each of the defect types for all the failure-type groups to produce the failure-type influenced defect-type total limited yield for each of defect types.

The processor 16 is capable of performing the weighting and combination processes by automatically forming a matrix and a vector and applying matrix processing to produce the failure-type influenced defect-type total limited yield for each of defect types. Each element of the matrix is a failure-type group-specific defect ratio. For example, the matrix can include the failure-type group-specific all defect ratios within a failure type group as a column, while the failure-type group-specific defect ratios for all failure-type groups as a row. More specifically, for example, the element at column x and row y is the failure-type x group-specific defect type y ratio within failure-type x group. The matrix processing also includes applying a natural logarithmic function to each failure type limited yield to create a vector. The processor 16 is also capable of calculating the product of the matrix and the vector to produce a natural logarithmic value of the failure-type influenced defect-type total limited yield. Further, e power function is applied to the natural logarithmic value of the failure-type influenced defect-type total limited yield to produce the failure-type influenced defect-type total limited yield. Further, the natural logarithmic function is:

$$\text{Ln}(LYofDy) = \sum_{x=1}^{m} (PofDyforFx) * \text{Ln}(LYofFx),$$

where: Ln is the natural logarithmic function of the following variables, LY is limited yield, Dy is defect type y, P is proportion, and Fx is failure type x. The processor 16 is capable of automatically ranking the physical defect types in inverse order to the failure-type influenced defect-type total limited yield.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof.

In the drawings herein, the same identification numeral identifies the same or similar item. The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   identifying failure types that caused defective items to fail testing using a processor;
   grouping the defective items by the failure types to produce failure-type groups using the processor;
   determining a failure-type limited yield within each of the failure-type groups using the processor;
   analyzing the defective items to identify defect types that caused failures using defect identification equipment;
   determining a failure-type group-specific defect ratio based on proportions of the defect types within each of the failure-type groups using the processor;
   weighting each of the failure-type group-specific defect ratio using the failure-type limited yield, to produce a weighted failure-type group-specific defect limited yield for each of the defect types within each of the failure-type groups using the processor;
   for each of the defect types, combining the weighted failure-type group-specific defect limited yield from each of the failure-type groups to produce a failure-type influenced defect-type total limited yield for each of defect types using the processor;
   ranking the defect types based on the failure-type influenced defect-type total limited yield using the processor; and
   correcting a design of manufactured items used to produce the defective items by fixing a defect with the lowest failure type influenced defect-type total limited yield based on the ranking.

2. The method according to claim 1, wherein the weighting and the combining are performed by forming a matrix and a vector and applying matrix processing to produce the failure-type influenced defect-type total limited yield, each element of the matrix is a failure-type group-specific defect ratio, and the matrix comprises:
   the failure-type group-specific defect ratios within a failure type group as a column; and
   the failure-type group-specific defect ratios for all failure-type groups as a row,
   the element at column x and row y is the failure-type x group-specific defect type y ratio within failure-type x group; and
   a natural logarithmic function to each failure type limited yield to create a vector.

3. The method according to claim 2, wherein the matrix processing further comprises calculating the product of the matrix and the vector to produce a natural logarithmic value of the failure-type influenced defect-type total limited yield, and applying e power function to the natural logarithmic value of the failure-type influenced defect-type total limited yield to produce the failure-type influenced defect-type total limited yield.

4. The method according to claim 3, wherein the natural logarithmic function comprises:

$$\mathrm{Ln}(LYofDy) = \sum_{x=1}^{m} (PofDyforFx) * \mathrm{Ln}(LYofFx),$$

where:
   Ln comprises the natural logarithmic function of the following variables;
   LY comprises limited yield;
   Dy comprises defect type y;
   P comprises proportion; and
   Fx comprises failure type x.

5. The method according to claim 1, wherein each of the defect types causes multiple ones of the failure types, and each of the failure types results from multiple ones of the defect types.

6. The method according to claim 1, wherein the testing comprises electrical testing, and the failure types comprise types of electrical signatures.

7. The method according to claim 1, wherein the defect types comprise characteristics of manufactured items that diverge from a design of the manufactured items.

8. A method comprising:
   testing manufactured items for failures to identify defective items using electrical testing equipment;
   identifying failure types that caused the defective items to fail the testing using a processor;
   grouping the defective items by the failure types to produce failure-type groups that each has one group-specific failure type using the processor;
   determining a first ratio of the number of defective items within each of the failure-type groups to the total number of the manufactured items, and subtracting the first ratio from 1, to produce a failure-type limited yield for each of the failure-type groups using the processor;
   within each failure-type group, of the failure-type groups:
      analyzing the defective items to identify physical defect types that caused failures using defect identification equipment;
      for each type of defect, of the physical defect types that caused the group-specific failure type, determining the number of devices that have that type of defect using the processor; and
      for each type of defect, of the physical defect types that caused the group-specific failure type, determining a second ratio of the number of devices that have that type of defect to the total number of defective items analyzed in the failure-type group, to produce a failure-type group-specific defect ratio using the processor;
   weighting each of the failure-type group-specific defect ratio using the failure-type limited yield of the failure-type group to produce a weighted failure-type group-specific defect limited yield for each of the physical defect types within the failure-type group using the processor;
   for each of the physical defect types, combining the weighted failure-type group-specific defect limited yield from each of the failure-type groups to produce a failure-type influenced defect-type total limited yield for each of the physical defect types using the processor;
   ranking the physical defect types in inverse order to the failure-type influenced defect-type total limited yield using the processor; and correcting a design of the manufactured items used to produce the defective items by fixing a defect with the lowest failure type influenced defect-type total limited yield based on the ranking.

9. The method according to claim 8, wherein the weighting and the combining are performed by forming a matrix and a vector and applying matrix processing to produce the failure-type influenced defect-type total limited yield, each element of the matrix is a failure-type group-specific defect ratio, and the matrix comprises:
the failure-type group-specific defect ratios within a failure type group as a column; and
the failure-type group-specific defect ratios for all failure-type groups as a row,
the element at column x and row y is the failure-type x group-specific defect type y ratio within failure-type x group; and
a natural logarithmic function to each failure type limited yield to create a vector.

10. The method according to claim 9, wherein the matrix processing further comprises calculating the product of the matrix and the vector to produce a natural logarithmic value of the failure-type influenced defect-type total limited yield, and applying e power function to the natural logarithmic value of the failure-type influenced defect-type total limited yield to produce the failure-type influenced defect-type total limited yield.

11. The method according to claim 10, wherein the natural logarithmic function comprises:

$$\mathrm{Ln}(LYofDy) = \sum_{x=1}^{m} (PofDyforFx) * \mathrm{Ln}(LYofFx)),$$

where:
Ln comprises the natural logarithmic function of the following variables;
LY comprises limited yield;
Dy comprises defect type y;
P comprises proportion; and
Fx comprises failure type x.

12. The method according to claim 8, wherein each of the physical defect types causes multiple ones of the failure types, and each of the failure types results from multiple ones of the physical defect types.

13. The method according to claim 8, wherein the testing comprises electrical testing, and the failure types comprise types of electrical signatures.

14. The method according to claim 8, wherein the physical defect types comprise characteristics of the manufactured items that diverge from a design of the manufactured items.

15. A system comprising:
electrical testing equipment capable of automatically testing manufactured items for failures to identify defective items;
a processor electrically connected to the electrical testing equipment, the processor is capable of automatically identifying failure types that caused the defective items to fail the testing; and
defect identification equipment electrically connected to the processor,
the processor is capable of automatically grouping the defective items by the failure types to produce failure-type groups that each has one group-specific failure type,
the processor is capable of automatically determining a first ratio of the number of defective items within each of the failure-type groups to the total number of the manufactured items, and subtracting the first ratio from 1, to produce a failure-type limited yield for each of the failure-type groups,
within each failure-type group, of the failure-type groups:
the defect identification equipment is capable of automatically analyzing the defective items to identify physical defect types that caused failures,
for each type of defect, of the physical defect types that caused the group-specific failure type, the processor is capable of automatically determining the number of devices that have that type of defect; and
for each type of defect, of the physical defect types that caused the group-specific failure type, the processor is capable of automatically determining a second ratio of the number of devices that have that type of defect to the total number of defective items analyzed in the failure-type group, to produce a failure-type group-specific defect ratio,
the processor is capable of automatically weighting each of the failure-type group-specific defect ratio using the failure-type limited yield of the failure-type group to produce a weighted failure-type group-specific defect limited yield for each of the physical defect types within the failure-type group,
for each of the physical defect types, the processor is capable of automatically combining the weighted failure-type group-specific defect limited yield from each of the failure-type groups to produce a failure-type influenced defect-type total limited yield for each of the physical defect types,
the processor is capable of automatically ranking the physical defect types in inverse order to the failure-type influenced defect-type total limited yield, and
wherein a design of the manufactured items used to produce the defective items is correctable by fixing a defect with the lowest failure type influenced defect-type total limited yield based on the ranking.

16. The system according to claim 15, wherein the processor is capable of performing the weighting and combining by automatically forming a matrix and a vector and applying matrix processing to produce the failure-type influenced defect-type total limited yield, each element of the matrix is a failure-type group-specific defect ratio, and the matrix comprises:
the failure-type group-specific defect ratios within a failure type group as a column; and
the failure-type group-specific defect ratios for all failure-type groups as a row, the element at column x and row y is the failure-type x group-specific defect type y ratio within failure-type x group; and
a natural logarithmic function to each failure type limited yield to create a vector.

17. The system according to claim 16, wherein the matrix processing further comprises calculating the product of the matrix and the vector to produce a natural logarithmic value of the failure-type influenced defect-type total limited yield, and applying e power function to the natural logarithmic value of the failure-type influenced defect-type total limited yield to produce the failure-type influenced defect-type total limited yield.

18. The system according to claim 17, wherein the natural logarithmic function comprises:

$$\mathrm{Ln}(LYofDy) = \sum_{x=1}^{m} (PofDyforFx) * \mathrm{Ln}(LYofFx),$$

where:
Ln comprises the natural logarithmic function of the following variables;
LY comprises limited yield;
Dy comprises defect type y;
P comprises proportion; and
Fx comprises failure type x.

19. The system according to claim 15, wherein each of the physical defect types causes multiple ones of the failure types, and each of the failure types results from multiple ones of the physical defect types.

20. The system according to claim 15, wherein the electrical testing equipment is capable of performing electrical testing, and the failure types comprise types of electrical signatures.

* * * * *